United States Patent

[11] 3,602,735

[72] Inventor Robert J. Lodi
Tewksbury, Mass.

[21] Appl. No. 862,664
[22] Filed Oct. 1, 1969
[45] Patented Aug. 31, 1971
[73] Assignee Sylvania Electric Products Inc.

[54] PULSE SHAPING CIRCUIT FOR USE IN INTEGRATED CIRCUIT NETWORKS

6 Claims, 1 Drawing Fig.

[52] U.S. Cl. .......... 307/214, 307/215, 307/263, 307/268
[51] Int. Cl. .......... H03k 19/40, H03k 19/34, H03k 5/12
[50] Field of Search .......... 307/213, 214, 215, 263, 268

[56] References Cited

UNITED STATES PATENTS

| | | | |
|---|---|---|---|
| 3,440,440 | 4/1969 | Prohofsky et al. .......... | 307/215 X |
| 3,522,444 | 8/1970 | Lourie .......... | 307/215 X |
| 3,555,294 | 1/1971 | Treadway .......... | 307/215 X |
| 3,229,119 | 1/1966 | Bohn et al. .......... | 307/214 X |

*Primary Examiner*—Stanley D. Miller, Jr.
*Attorneys*—Norman J. O'Malley, Elmer J. Nealon and David M. Keay

ABSTRACT: Pulse shaping circuit having fast rise and fall times. Two transistors are arranged with their emitters connected together and the base of the second transistor connected to the collector of the first so that the second transistor is OFF when the first is ON and ON when the first is OFF. A third transistor has its collector connected to the juncture of the emitters of the first and second transistors and its emitter connected to ground. The base of an output transistor is connected to the juncture. When a positive-going input signal is applied to an input terminal which is coupled to the bases of the first and third transistors through first and second input circuits, respectively, the first and third transistors are switched ON, thus rapidly turning the output transistor OFF. A negative-going input signal switches the first and third transistors OFF causing the second transistor to turn ON and switch the output transistor ON.

PATENTED AUG 31 1971 3,602,735
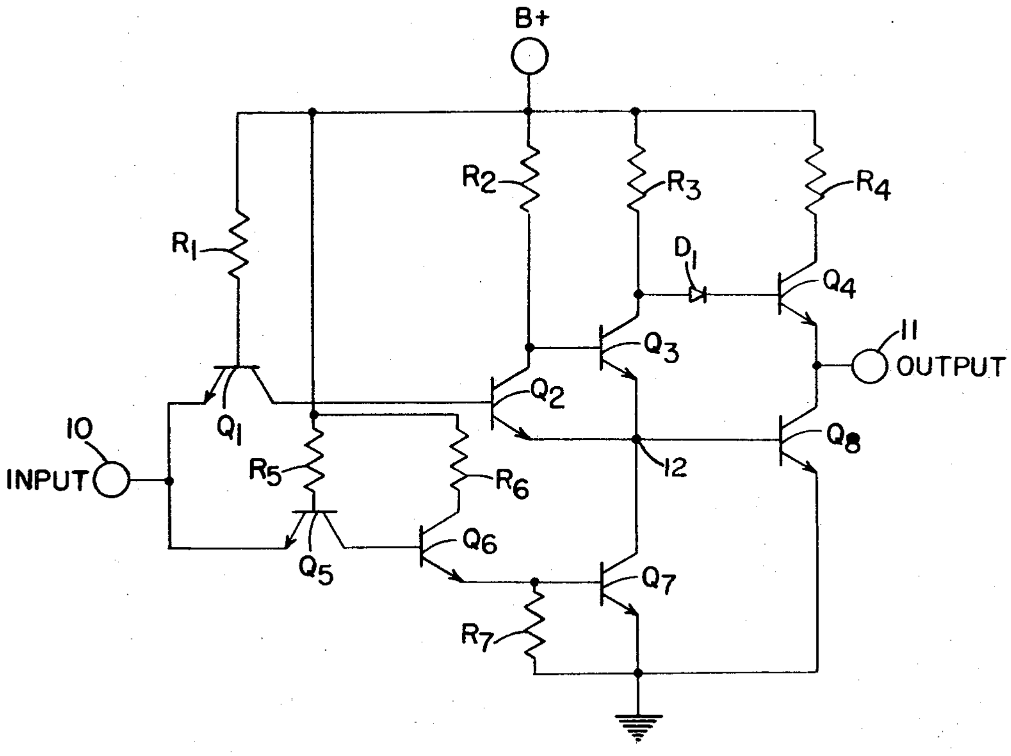
INVENTOR.
ROBERT J. LODI
BY David M. Keay
AGENT.

PULSE SHAPING CIRCUIT FOR USE IN INTEGRATED CIRCUIT NETWORKS

BACKGROUND OF THE INVENTION

This invention relates to pulse shaping circuits. More particularly, it is concerned with circuits for shaping input waveforms for driving logic circuits.

In many applications signals which are to be employed to drive logic circuits do not have satisfactory wave shapes, but have excessive slopes at their leading and trailing edges. If these signals are applied directly to logic circuits, they may cause unstable conditions at the outputs of the logic circuits.

In order to improve the waveforms of the input signals for driving the logic circuits, pulse shaping circuits which alter the shape of the signal waveform to provide square wave pulses having sharp leading and trailing edges (fast rise and fall times) may be employed. At the present time logic circuits which are fabricated as monolithic integrated circuit networks are widely used. Therefore, it is desirable to employ a pulse shaping circuit which is also amenable to fabrication as a monolithic integrated circuit network. The pulse shaping circuit may then be fabricated together with the logic circuits on the same wafer of semiconductor material.

BRIEF SUMMARY OF THE INVENTION

A pulse shaping circuit in accordance with the invention includes first and second circuit means each of which has a first operating condition and a second operating condition. The first circuit means is connected to the second circuit means by means whereby the second circuit means operates in the second operating condition when the first circuit means is in the first operating condition and whereby the second circuit means operates in the first operating condition when the first circuit means is in the second operating condition.

A third circuit means which has a first and a second operating condition is connected to the first and second circuit means.

The circuit also includes an input terminal and first and second input means, each of which is connected to the input terminal. The first input means is connected to the first circuit means and is operable to cause the first circuit means to operate in the first operating condition in response to the presence of a first input signal condition at the input terminal, and is operable to cause the first circuit means to operate in the second operating condition in response to the presence of a second input signal condition at the input terminal.

Similarly, the second input means is connected to the third circuit means and is operable to cause the third circuit means to operate in the first operating condition in response to the presence of the first input signal condition at the input terminal and is operable to cause the third circuit means to operate in the second operating condition in response to the presence of the second input signal condition at the input terminal. The circuit also includes an output terminal and output circuit means which is connected to the second circuit means, the third circuit means, and to the output terminal. The output circuit means operates in a first operating condition to produce a first output condition at the output terminal when the second circuit means is in the first operating condition and the third circuit means is in the second operating condition; and the output circuit means operates in a second operating condition to produce a second output condition at the output terminal when the second circuit means is in the second operating condition and the third circuit means is in the first operating condition.

BRIEF DESCRIPTION OF THE DRAWINGS

Additional objects, features, and advantages of pulse shaping circuits according to the invention will be apparent from the following detailed discussion and the accompanying drawing wherein the single figure is a schematic circuit diagram of a pulse shaping circuit of the invention.

DETAILED DESCRIPTION OF THE INVENTION

As illustrated in an schematic circuit diagram of the drawing a pulse shaping circuit in accordance with the invention includes an input terminal 10 which is connected directly to the emitters of first and second NPN input transistors $Q_1$ and $Q_5$. The bases of transistors $Q_1$ and $Q_5$ are connected through resistances $R_1$ and $R_5$, respectively, to a B+ voltage source. The collector of transistor $Q_1$ is connected directly to the base of an NPN transistor $Q_2$ which has its collector connected through a resistance $R_2$ to the B+ voltage source. The collector of transistor $Q_5$ is connected directly to an NPN coupling transistor $Q_6$ which has its collector connected through a resistance $R_6$ to the B+ voltage source. The emitter of transistor $Q_6$ is connected through a resistance $R_7$ to ground and directly to the base of an NPN transistor $Q_7$. The emitter of transistor $Q_2$ is connected directly to the collector of transistor $Q_7$ and the emitter of transistor $Q_7$ is connected directly to ground.

The collector of transistor $Q_2$ is also connected directly to the base of an NPN transistor $Q_3$. The collector of transistor $Q_3$ is connected through a resistance $R_3$ to the B+ voltage source and its emitter is connected directly to the emitter of transistor $Q_2$ and the collector of transistor $Q_7$. The juncture 12 of the emitters of transistors $Q_2$ and $Q_3$ and the collector of transistor $Q_7$ is connected directly to the base of an NPN output transistor $Q_8$. The emitter of transister $Q_8$ is connected directly to ground and the collector is connected directly to an output terminal 11.

The collector of transistor $Q_3$ is also connected through a diode $D_1$ to the base of an NPN transistor $Q_4$. The collector of transistor $Q_4$ is connected through a resistance $R_4$ to B+ voltage source and its emitter is connected directly to the output terminal and the collector of the output transistor $Q_8$.

When a low voltage level signal is present at the input terminal 10, the base-emitter junctions of both transistors $Q_1$ and $Q_5$ are forward biased and current flows from the B+ voltage source through the base resistances $R_1$ and $R_5$ and across the base-emitter junctions to the input terminal. The voltage at the collectors of transistors $Q_1$ and $Q_5$ is held at a low level and no significant current flows in their collector circuits. This low voltage applied to the bases of transistors $Q_2$ and $Q_6$ biases both of these transistors in the nonconducting condition. Since transistor $Q_6$ is in the nonconducting condition, transistor $Q_7$ is also biased in the nonconducting condition. Transistor $Q_7$ thus provides a high impedance between the juncture 12 and ground.

Since transistor $Q_2$ is biased to a nonconducting condition, no current flows in its collector circuit and a high voltage level is present at its collector and, therefore, at the base of transistor $Q_3$. This voltage level is sufficient to forward bias the base-emitter junctions of transistors $Q_3$ and $Q_8$ causing them to conduct. Transistor $Q_7$ provides a high impedance between the juncture 12 and ground, therefore current flows from the emitter of transistor $Q_3$ across the base-emitter junction of output transistor $Q_8$ causing that transistor to conduct heavily. Transistor $Q_8$ thus provides a very low impedance between the output terminal 11 and ground, and establishes a low voltage level at the output terminal 11.

SInce transistor $Q_3$ is in a heavily conducting condition, a relatively low voltage level is established at its collector. Thus transistor $Q_4$ is biased to a nonconducting condition.

The circuit remains stable in the foregoing operating state until a positive-going input signal is applied to the input terminal 10. As the emitter of transistor $Q_1$ becomes more positive, current flowing through resistance $R_1$ and across the base-emitter junction of transistor $Q_1$ decreases. Similarly, the current flowing through resistance $R_5$ and across the base-emitter junction of transistor $Q_5$ also decreases.

As the voltage at the emitters of transistors $Q_1$ and $Q_5$ increases, the voltages at their collectors also increase. The voltages at the collectors are only 1 or 200 millivolts higher than at the emitters. When the voltages at the collectors of transistors $Q_1$ and $Q_5$ become sufficiently high, transistors $Q_2$ and $Q_6$ 78 are biased to conduction and currents flow in the collector circuits of transistors $Q_1$ and $Q_5$. This action occurs when the voltage at the base of transistor $Q_2$ is equal to the sum of the base-emitter voltage drops during conduction of two transistors, $Q_2$ and $Q_8$. Similarly, transistor $Q_6$ is biased to conduction when the voltage at the base of transistor $Q_6$ is equal to the sum of the base-emitter voltage drops during conduction of two transistors, $Q_6$ and $Q_7$. Thus the threshold voltage at the input terminal is slightly less than the base-emitter voltage drop of two conducting transistors in series.

When transistor $Q_6$ conducts, current flows from the emitter of transistor $Q_6$ into the base of transistor $Q_7$ causing transistor $Q_7$ to become conductive and provide a low impedance path between the juncture 12 and ground. As transistor $Q_2$ starts to conduct, the voltage drop across its collector resistance $R_2$ reduces the voltage at the base of transistor $Q_3$ decreasing current flow through transister $Q_3$. Heavy conduction through transistor $Q_7$ lowers the voltage at the emitter of transistor $Q_2$ further increasing the flow of current through transistor $Q_2$ and rapidly switching transistor $Q_3$ to the nonconducting condition.

When transistor $Q_7$ becomes conductive, current flowing from the emitters of transistors $Q_2$ and $Q_3$ is diverted away from the base of transistor $Q_8$ causing transistor $Q_8$ to become nonconducting. The speed at which transistor $Q_8$ turns off is increased because conductive transistor $Q_7$ provides a direct path to discharge to ground any charge stored in a base of transistor $Q_8$.

As transistor $Q_3$ becomes nonconductive, the voltage at its collector rises and the base-emitter junction of transistor $Q_4$ becomes forward biased. Transistor $Q_4$ conducts heavily to charge any capacitance in the load connected to the output terminal 11 and increase the voltage level at the output terminal 11. Transistor $Q_4$ conducts only sufficiently to provide any current as required by the load connected to the output terminal 11, thus establishing a relatively high voltage level at the output terminal 11 equal to the B+ voltage less the voltage drop caused by the transistor base current flowing through resistance $R_3$, the voltage across the junction of diode $D_1$, and the voltage across the base-emitter junction of transistor $Q_4$.

The circuit remains stable in this state until a negative going input signal is applied to the input terminal 10. As the voltage at the input terminal 10 is reduced, the base-emitter junctions of transistors $Q_1$ and $Q_5$ become forward biased and currents flow from the B+ voltage source through resistances $R_1$ and $R_5$ across the base-emitter junctions to the input terminal. The voltages at the bases of transistors $Q_2$ and $Q_6$ are reduced, and when they are reduced below the voltage levels necessary to forward bias their base-emitter junctions into conduction, the transistors $Q_2$ and $Q_6$ become nonconducting.

During this action the voltage at the base of transistor $Q_2$ is equal to the voltage at the emitter of transistor $Q_1$ plus the base-emitter voltage drop of transistor $Q_1$ in conduction less the base-collector voltage drop of transistor $Q_1$ in conduction. These voltage drops are such that transister $Q_1$ becomes nonconducting when the voltage at the input terminal is approximately the same as the voltage which initiates conduction in transistor $Q_2$ during a positive-going signal.

When transistor $Q_6$ becomes nonconducting, conduction through transistor $Q_7$ also stops and that transistor provides a high impedance between the juncture 12 and ground. As transistor $Q_2$ becomes nonconducting, the voltage at its collector rises biasing transistor $Q_3$ to conduction. Since transistor $Q_7$ now provides a high impedance, current flows from the emitter of transistor $Q_3$ into the base of transistor $Q_8$. Transistors $Q_3$ and $Q_8$ both conduct heavily, and the voltage at the output terminal 11 is reduced to the relatively low voltage level established by the collector-to-emitter voltage drop of transistor $Q_8$.

The circuit as described provides rapid switching between operating states when triggered by the signal at the input terminal reaching the threshold level. Thus, despite the slope of the waveform applied to the input terminal, pulses having sharp leading and trailing edges (rapid rise and fall times) are produced at the output terminal. THe circuit has approximately the same threshold for switching during either the positive-going or negative-going edge of a pulse. That is, there is substantially no hysteresis in the circuit, and thus the circuit responds satisfactorily to high frequency input signals.

The circuit as described employs only NPN transistors and resistances which are readily fabricated by known methods of producing monolithic integrated circuit networks. Thus the circuit is particularly useful as a pulse shaping circuit for improving the waveforms of input signals to be applied to logic circuits fabricated as monolithic integrated circuit networks. The circuit may be fabricated on the same semiconductor wafer with logic circuits thereby providing significant economies in fabrication and interconnection of the circuits.

While there has been shown and described what is considered a preferred embodiment of the present invention, it will be obvious to those skilled in the art that various changes and modifications may be made therein without departing from the invention.

WHAT IS CLAIMED IS:

1. A pulse shaping circuit including in combination first circuit means having a first operating condition and a second operating condition;

second circuit means having a first operating condition and a second operating condition means connecting said first circuit means to said second circuit means and operable to cause said second circuit means to operate in the second operating condition when the first circuit means is in the first operating condition and operable to cause said second circuit means to operate in the first operating condition when the first circuit means is in the second operating condition;

third circuit means connected to the first and second circuit means and having a first operating condition and a second operating condition;

an input terminal;

first input means connected to the input terminal and to the first circuit means and operable to cause the first circuit means to operate in the first operating condition in response to the presence of a first input signal condition at the input terminal and operable to cause the first circuit means to operate in the second operating condition in response to the presence of a second input signal condition at the input terminal;

second input means connected to the input terminal and to the third circuit means and operable to cause the third circuit means to operate in the first operating condition in response to the presence of the first input signal condition at the input terminal and operable to cause the third circuit means to operate in the second operating condition in response to the presence of the second input signal condition at the input terminal;

an output terminal; and output circuit means connected to the second circuit means, the third circuit means, and the output terminal, and operable in a first operating condition to produce a first output condition at the output terminal when the second circuit means is in the first operating condition and the third circuit means is in the second operating condition, and operable in a second operating condition to produce a second output condition at the output terminal when the second circuit means is in the second operating condition and the third circuit means is in the first operating condition.

2. A pulse shaping circuit in accordance with claim 1 wherein said first circuit means includes a first transistor having a high conduction condition when the first circuit means is in the first operating condition and a low conduction condition when the first circuit means is in the second operating condition;

said second circuit means includes a second transistor connected to the first transistor and having a high conduction condition when the second circuit means is in the first operating condition and having a low conduction condition when the second circuit means is in the second operating condition;

said third circuit means includes a third transistor connected to the first and second transistors and to a first source of reference potential and having a high conduction condition when the third circuit means is in the first operating condition and having a low conduction condition when the third circuit means is in the second operating condition; and said output circuit means includes an output transistor connected to the second transistor and to the third transistor and having a high conduction condition when the output circuit means is in the first operating condition and having a low conduction condition when the output circuit means is in the second operating condition.

3. A pulse shaping circuit in accordance with claim 2 wherein said first transistor has its base connected to the first input means, its collector connected to the base of the second transistor and coupled to a second source of reference potential, and its emitter connected to the emitter of the second transistor and to the collector of the third transistor;

said second transistor has its collector coupled to the second source of reference potential, and its emitter connected to the base of the output transistor;

said third transistor has its base connected to the second input means, and its emitter connected to the first source of reference potential; and said output transistor has its collector coupled to the second source of reference potential and connected to the output terminal, and its emitter connected to the first source of reference potential.

4. A pulse shaping circuit in accordance with claim 3 wherein the emitter of the first transistor, the emitter of the second transistor, and the collector of the third transistor, and the base of the output transistor are connected directly to each other;

the emitter of the third transistor and the emitter of the output transistor are connected directly to the first source of reference potential;

said first input means includes a first input transistor having its emitter connected to the input terminal, its base coupled through a resistance to the second source of reference potential, and its collector connected to the base of said first transistor; and said second input means includes a second input transistor having its emitter connected to the input terminal, and its base coupled through a resistance to the second source of reference potential, and a coupling transistor having its base connected to the collector of the second input transistor, its collector coupled to the second source of reference potential, and its emitter connected directly to the base of said third transistor.

5. A pulse shaping circuit including in combination a first transistor having its collector coupled to a source of reference potential;

a second transistor having its collector coupled to the source of reference potential, its base connected directly to the collector of the first transistor and its emitter connected directly to the emitter of the first transistor;

said second transistor being biased to a high conduction condition when the first transistor is in a low conduction condition and being biased to a low conduction condition when the first transistor is in a high conduction condition;

a third transistor having its collector connected directly to the emitters of the first and second transistors and its emitter connected directly to another source of reference potential;

an input terminal first input means connected to the input terminal and to the base of the first transistor and operable to bias the first transistor to the high conduction condition in response to the presence of a first input signal condition at the input terminal and operable to bias the first transistor to the low conduction condition in response to the presence of a second input signal condition at the input terminal;

second input means connected to the input terminal and to the base of the third transistor and operable to bias the third transistor to a high conduction condition in response to the presence of the first input signal condition at the input terminal and operable to bias the third transistor to a low conduction condition in response to the presence of the second input signal condition a the input terminal;

an output terminal; and an output transistor having its collector coupled to said first-mentioned source of reference potential and connected to the output terminal, its base connected directly to the emitters of the first and second transistors and to the collector of the third transistor, and its emitter connected directly to the other source of reference potential;

said output transistor being biased to a high conduction condition to produce a first output signal level at the output terminal when the second transistor is in the high conduction condition and the third transistor is in the low conduction condition, and being biased to a low conduction condition to produce a second output signal level at the output terminal when the third transistor is in the high conduction condition.

6. A pulse shaping circuit in accordance with claim 5 wherein said first input means includes a first input transistor having its emitter connected to the input terminal, its base coupled through a resistance to the first-mentioned source of reference potential, and its collector connected to the base of said first transistor;

said first transistor being switched from a low conduction condition to a high conduction condition when the voltage present at the input terminal increases to produce a voltage at the collector of the first input transistor which is sufficient to bias the first transistor to the high conduction condition;

said first transistor being switched from the high conduction condition to the low conduction condition when the voltage present at the input terminal decreases to produce a voltage at the collector of the first input transistor which is below that sufficient to bias the first transistor to the high conduction condition;

said second input means includes a second input transistor having its emitter connected to the input terminal, and its base coupled through a resistance to the first-mentioned source of reference potential, and a coupling transistor having its base connected to the collector of the second input transistor, its collector coupled to the first-mentioned source of reference potential, and its emitter connected directly to the base of said third transistor;

said coupling transistor being switched from a low conduction condition to a high conduction condition causing current to flow into the base of the third transistor biasing the third transistor to the high conduction condition when the voltage present at the input terminal increases to produce a voltage at the collector of the second input transistor which is sufficient to bias the coupling transistor to the high conduction condition; and said coupling transistor being switched from the high conduction condition to the low conduction condition biasing the third transistor to the low conduction condition when the voltage present at the input terminal decreases to produce a voltage at the collector of the second input transistor which is below that sufficient to bias the coupling transistor to the high conduction condition.